United States Patent [19]
Tomasetti et al.

[11] Patent Number: 5,338,987
[45] Date of Patent: Aug. 16, 1994

[54] HIGH SPEED, LOW POWER HIGH COMMON MODE RANGE VOLTAGE MODE DIFFERENTIAL DRIVER CIRCUIT

[75] Inventors: Stephen R. Tomasetti, Lewisville, Tex.; Danny Tsong, Taipei, Taiwan

[73] Assignee: Texas Instruments Incorporated, Dallas, Tex.

[21] Appl. No.: 150,741

[22] Filed: Nov. 12, 1993

Related U.S. Application Data

[63] Continuation of Ser. No. 782,929, Oct. 25, 1991, abandoned.

[51] Int. Cl.⁵ ............................ H03K 3/01; H03K 19/02
[52] U.S. Cl. ............................ 307/570; 307/270; 307/446; 307/317.2; 307/544; 307/547
[58] Field of Search ............ 307/570, 446, 303, 544, 307/546–548, 270, 262, 300, 317.2

[56] References Cited

U.S. PATENT DOCUMENTS 5,027,009  6/1991  Urakawa et al. ............... 307/570
5,140,190  8/1992  Yoo et al. ....................... 307/446

*Primary Examiner*—Margaret Rose Wambach
*Attorney, Agent, or Firm*—Mark E. Courtney; Richard L. Donaldson; Wade James Brady

[57] ABSTRACT

A BiCMOS output driver for a transceiver circuit has a pull-up/pull-down circuit with CMOS transistors supplying base current to bipolar pull-up/pull-down transistors. In its quiescent state, the CMOS transistors draw no current. A current mirror circuit comprising a pair of bipolar transistors sized to be a fraction of the pull-up/pull-down transistors is coupled between the input and output of the pull-up/pull-down circuit to prevent exceeding a predetermined current. A speed up circuit comprising CMOS transistors coupled between ground and the base of the bipolar pull-up/pull-down transistors to speed up the shut off of the transistors.

9 Claims, 2 Drawing Sheets

HIGH SPEED, LOW POWER HIGH COMMON MODE RANGE VOLTAGE MODE DIFFERENTIAL DRIVER CIRCUIT

This application is a continuation of application Ser. No. 07/782,929, filed Oct. 25, 1991, now abandoned.

FIELD OF THE INVENTION

This invention relates in general to transceivers, and, in particular to driver circuits for transceivers.

BACKGROUND OF THE INVENTION

A transceiver is an electrical device for sending and receiving electrical signals, in particular signals representative of data in a digital format. A transceiver is disposed at the interface between one system or device and a transmission line coupled to another system or device. For example, a transceiver is used at the output of a computer to transmit the computer output over a wire to a peripheral device, such as a video display terminal or a printer. Many systems that have a central processing unit or microprocessor or microcomputer use transceivers. Such systems may be computers, telephone systems, disk drives, automotive control systems and other industrial system. The transmission line connectible to the transceiver may be a ribbon, coaxial cable or a twisted pair of wires. The latter transmission line is typically coupled to a transceiver that conforms to the RS 485 interface standard.

A transceiver comprises two parts, a driver and a receiver. The driver has an input coupled to the output of a system, typically at the serial output of a UART (universal asynchronous receiver transmitter) device. The UART device converts the normal parallel data bits on a computer bus to a stream of serial bits. That serial stream of bits forms the input signal to the driver circuit of a transceiver. The driver circuit converts the logic level signal of the input to a level compatible with the transmission line. For example, the driver may convert a TTL, ECL or CMOS logic level signal to an RS 485 signal having a differential voltage equal to or greater than 1.5 volts and capable of driving a 54 ohm load.

Prior art driver circuits have been integrated onto a single semiconductor substrate using only bipolar transistors. Such devices have high speed and high drive capability but also consume large amounts of power even when no signal is being driven. Bipolar transistor circuits usually have bias current sources that power the bipolar transistors even when no signal is being driven. In addition, the number of transceivers that could be integrated onto a single semiconductor substrate has been limited by the power consumption of the bipolar transistors. At present, no more than four RS485 type transceivers can be integrated onto a single substrate, but it is desirable to increase the density of integration by adding more, high drive, high speed bipolar drive circuits to the transceiver substrate.

One solution to the power consumption problem has been to use only CMOS transistors in the driver circuit. However, pure CMOS circuits have several limitations. One is component breakdown voltage. CMOS devices simply cannot handle the voltage ranges of input signals to achieve an acceptable range of common mode operation. Common mode operation is a measure of driver performance.

Accordingly, there exists a long felt need for a transceiver with a driver having low power consumption in its quiescent state, a high common mode operation, and high speed.

SUMMARY OF THE INVENTION

The invention solves the problems of the prior art and meets the long felt need in the art by providing a transceiver with BiCMOS circuitry. The invention arranges the CMOS transistors to minimize power comsumption in a quiescent state and the bipolar transistors to drive and switch the load.

In particular, the transceiver driver circuit has a pull up/pull down circuit with CMOS transistors supply base current to the bipolar pull up and pull down transistors. In its quiescent state the CMOS transistors draw no current so the power consumption of the circuit under no load conditions is minimized. The invention allows the integration of five or more transceivers with bipolar differential driver circuits on one substrate.

The driver circuit of the invention also includes a current mirror circuit. The current mirror circuit protects the driver from exceeding the drive current and voltage for the transmission line and the rated currents and voltages of the pull up/pull down transistors. The current mirror is coupled between the input and output of the pull up/pull down circuit. It measures the output current. If a predetermined output current is exceeded, the current mirror circuits turn off the current supply to the base of the bipolar transistor. The current mirror circuit comprises a pair of bipolar transistors sized to be a fraction of the size of the pull up/pull down transistors.

The driver circuit also has a speed up circuit. The speed up circuit comprises CMOS transistors coupled between ground and the base of the bipolar pull up/pull down transistors. The gates of the speed up bipolar transistors are coupled to the input of the driver. When the input driver signal goes low, the gates turn on to connect the appropriate base of the pull up or pull down transistor to ground and thereby speed up the shut off of the pull up or pull down transistor.

DETAILED DESCRIPTION OF INVENTION

Figure 1:
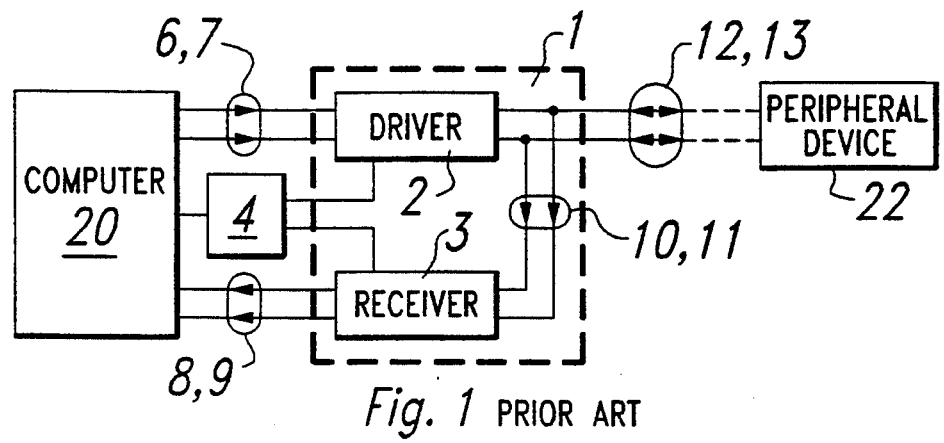
FIG. 1. is a block diagram of a system using a transceiver.

Turning to FIG. 1, there is shown a first system 20, for example a computer having a transceiver 1 coupled to a pair of transmission lines 12, 13 which terminate at a peripheral device 22, such as a video display terminal or a printer. The transceiver 1 comprises a driver circuit 2 or a receiver circuit 3. In response to a signal, output from the computer 20 to a chip enable function pin 4, the transceiver 1 will enable either the driver 2 or the receiver 3. Information in the form of single-ended digital signals is output from the computer 20 typically over a large bus, including a number of lines such as Lines 6 and 7. line 6, for example, meets a single-ended signal which is converted by the driver circuit 2 to a signal level compatible with the requirements of transmission lines 12, 13. In the preferred embodiment, the transmission lines 12, 13 are designed to match a standard RS485 interface. The transmission lines are also coupled via lines 10 and 11 to receiver circuit 3. Chip enable pin 4 will couple the output of receiver 3 consisting of single-ended signals to computer 20 input via a line such as 8 or 9. Lines 8, 9 are generally also part of a large bus of computer 20. The system shown in FIG. 1 has a single transceiver. Current levels of integration compatible with bipolar circuits allow for an integration of a maximum of four transceivers on a single semiconductor substrate. However, with the subject invention, it is possible to integrate five or more transceivers on a single substrate. So far, the invention has been successful in integrating as many as nine transceivers on a single substrate.

Figure 2:
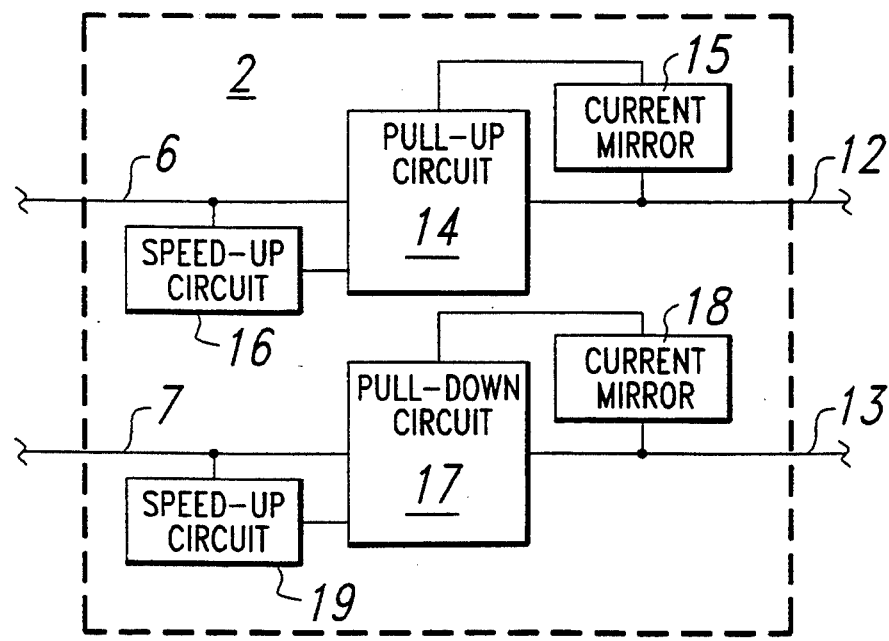
FIG. 2. is a block diagram of a differential driver for the transceiver of FIG. 1.

The driver circuit 2 is shown in further schematic detail in FIG. 2. The signal on line 6 passes through a single-ended to differential signal transmitter such as is known in the art and are input to pull up/pull down circuits 14, 17. Both of the pull up/pull down circuits 14, 17 comprise bipolar drive transistors with MOS current sources providing power to the basis of the drive transistors. The details of a typical driver circuit will be discussed further in connection with FIG. 3. Pull up/pull down circuits 14, 17 each have an output circuit mirror circuit 15, 18, respectively coupled between the outputs of the pull up/pull down circuits and the circuits themselves. The current mirror circuits 15, 18 measure the output on transmission lines 12, 13. If the output exceeds a certain predetermined level, then the current mirrors terminate the input drive to the pull up/pull down circuits 14, 17. Pull up/pull down circuits 14, 17 also have speed up circuits 16, 19, respectively coupled thereto. The speed up circuits 16, 19 sense the input signal level on input lines. When the input signal falls to a predetermined level indicating no signal on lines 6, 7, the speed up circuits 16, 19 assist in rapidly turning off the current sources that provide current for the pull up/pull down circuits.

Figure 3:
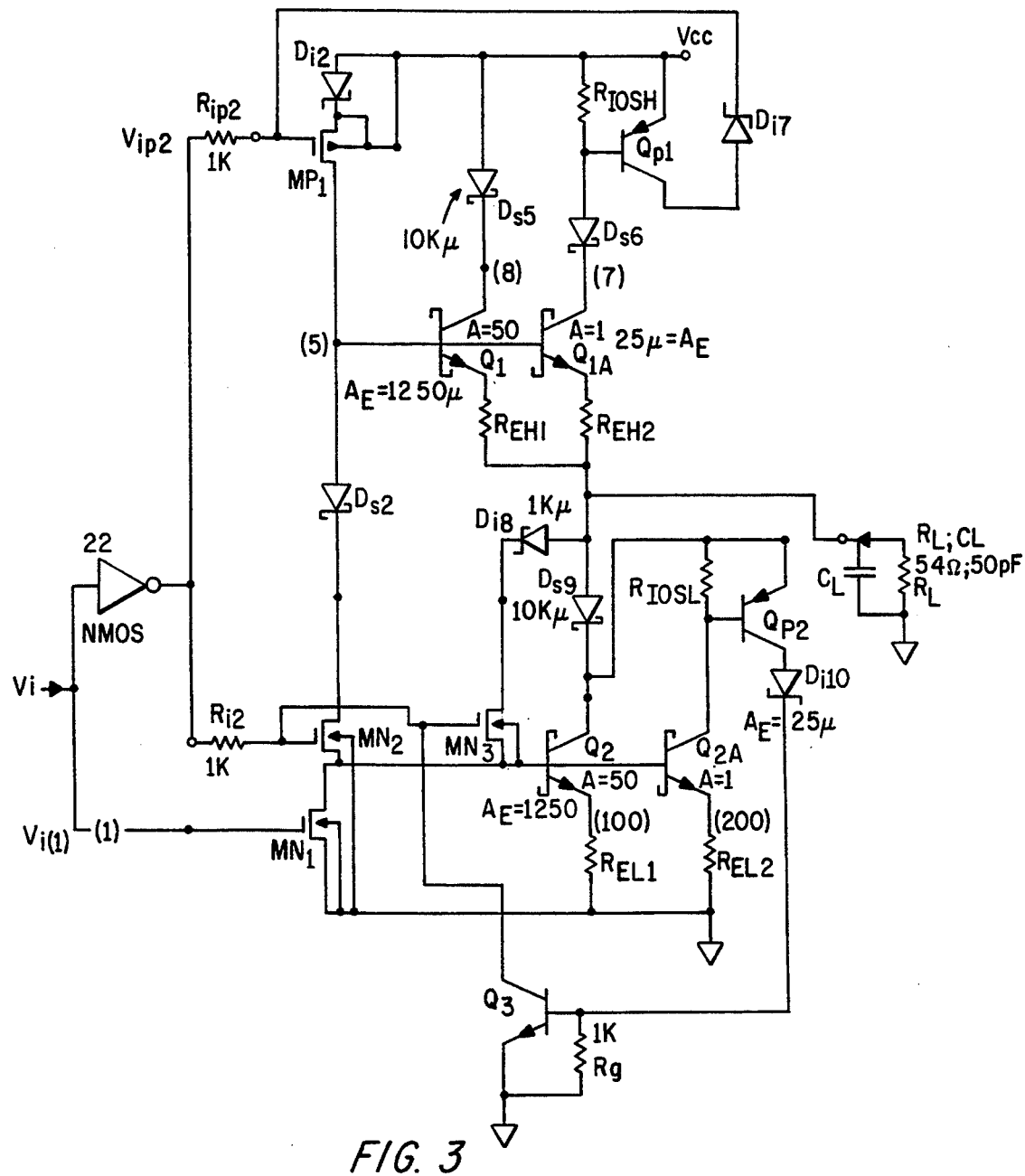
FIG. 3. is an electrical schematic of half of the differential driver of FIG. 2.

Turning to FIG. 3, there is shown a schematic diagram of one of the driver circuits 14, 17 of FIG. 2. An input voltage Vi is provided to the gate of an nmos transistor mn1, and to the input of an inverter 22. The output of inverter 22 is connected to the gate of a p-channel transistor mp1 through a resistor Rip2, and to the gate of an n-channel transistor mn2 through resistor Ri2.

The drain of p-channel transistor mp1 is connected to the bases of NPN transistors Q1 and Q2, as well as to the anode of Schottky diode Di1. The drain of transistor mp1 is connected to the cathode of Schottky diode di2, the anode of which is connected to a supply voltage Vcc.

The collector of transistor Q1 is connected to Vcc through Schottky diode Di5, while the collector of transistor Q2 is connected to Vcc through resistor Riosh and Schottky diode Di6. Resistor Riosh is also connected across the emitter and base of a PNP transistor Qp1, which has its emitter connected to Vcc. The emitter of transistor Qp1 is connected to the gate of transistor Mp1 through a Schottky diode Di7.

The emitters of transistors Q1 and Q2 are connected to node 6 through resistors Reh1 and Reh2, respectively.

The gate of transistor mn2 is connected to the gate of an n-channel transistor Mn3 and to the collector of an NPN transistor Q3. The source of transistor Mn2 is connected to the drain of transistor Mn1 and to the bases of NPN transistors Q2 and Q2a, as well as to the source of transistor Mn3. The drain of transistor Mn3 is connected to node 6 through Schottky diode Di8.

The collector of transistor Q2 is connected to node 6 through Schottky diode Di9, as well as to one end of resistor Riosh, which has its other end connected to the base of a PNP transistor Qp2, and to the collector of transistor Qp2. The collector of transistor Q2a is connected to the base of transistor Qp2. The emitters of transistors Q2 and Q2a are connected to ground through resistors Rel1 and Rel2, respectively.

The collector of transistor Qp2 is connected to the base of transistor Q3. The base of Q3 is connected to ground through resistor Rg, while the emitter of Q3 is connected to ground, as is the source of transistor Mn1.

The circuit shown in FIG. 3 provides a push-pull drive to one end of a differential transmission line, shown as R1 and C1 at node 6.

A logic input signal Vi is provided at the input of the driver circuit 20. A complementary signal Vip2 is generated with the use of inverter 22, preferably a simple CMOS inverter. When Vi is high, Vip2 goes low, turning on transistor Mp1, which provides base drive current for the pull up stage output transistor Q1, which provides drive current to the load.

At the same time, since Vip2 is low, transistor Mn2 is turned off, so as not to drain current from drive transistor Q1. Mn3 is also simultaneously turned off to prevent current drain from node 6.

Q1a, Qp1, Riosh and Rip2 form a current limiting circuit, which is a requirement of RS485. Q1 and Q1a are matched as scaled to each other such that the collector current of Q1a is a multiple of the collector current of Q1. In the preferred embodiment, the scaling factor is fifty to one. As the output impedance drops (going toward a short circuit condition on the output), there is a voltage drop across the base-emitter junction of Qp1. As it goes up and reaches forward bias voltage, Qp1 delivers collector current back to the gate of Mp1, generating a voltage drop across Rip2, turning Mp1 off. Riosh is chosen so that at the appropriate Q1a collector current, Qp1 is turned on. The scaling factor between Q1 and Q1a is chosen such that the value of Riosh can be reasonable, and thus easily manufacturable.

When Vi is high, it also is provided to the gate of Mn1, turning it on, which provides a low impedance path from the bases of sink transistors Q2 and Q2a, helping turn them off.

When Vi is low, inverter 22 provides a high signal to PMOS transistor Mp1, turning it off, which then removes the drive current from sourcing transistors Q1 and Q1a. At the same time, the high signal is provided to the gate of Mn2 and to Mn1. The source of Mn2 is thus tied to base of Q2, while its drain is connected to the bases of Q1 and Q1a through DS2. This provides a discharge path for its stored base charge, which provides for a quick turn off, allowing the circuit to operate with zero quiescent current under no load conditions. It also provides a brief surge of current which is used to help turn Q2 on.

Simultaneously, Mn3 is also turned on, tied from the output node 6 to the bases of drain transistors Q2 and Q2a. Thus, the base drive current for sink transistors Q2 and Q2a actually comes from the load, which is an advantage. The base drive, which would normally account for 10-15% of the power required, would conventionally come from the power supply. This configuration allows minimum power dissipation.

The sink transistors have the same ratio that the drive transistors Q1a and Q1a have. The current through Q2a is monitored in a similar manner to the current through Q1a. Q2a, Q2a, Qp2, Riosl and Ri2 form the current limiting circuit for the sink transistors Q2 and Q2. When the voltage drop across Riosl reaches one Vbe, transistor Qp2 turns on, which provides base current to Q3, turning Q3 on, which in turn sinks the drive signal to the gate of Mn2 and Mn3, turning them off, which removes the drive current from the bases of Q2 and Q2a, turning them off.

Schottky blocking diodes are used with high voltage MOS and bipolar components to allow extended output common mode range above Vcc and below ground, as required by RS485. For the pull-up stage, Di2 blocks the current path through the drain-backgate diode of Mp1 when the output is pulled above Vcc. Ds5 and Ds6 provide similar blocking under the same conditions for the base collector diodes of Q1 and Q1a.

For the pull down stage, Ds7 provides blocking for the current path formed by the base-collector diodes of Q2 and Q2a.

Although the invention has been described and illustrated with a certain degree of particularity, is understood that the present disclosure has been made by way of example only and that numerous changes in the combination and arrangement of parts or steps may be resorted to by those skilled in the art without departing from the scope and spirit of the invention.

What is claim is:

1. A driver circuit having an input node and an output node, comprising:
    a first current source coupled to the input node and coupled to a voltage supply;
    a first bipolar transistor having a base coupled to the current source, and being coupled to the voltage supply and the output node;
    a first current limiting circuit coupled to the output node and the first bipolar transistor;
    a second current source coupled to the input node and a second voltage supply;
    a second bipolar transistor having a base coupled to the second current source and further coupled between the second voltage supply and the output node;
    a second current limiting circuit coupled to the output node and the second bipolar transistor; and
    a third bipolar transistor having a base coupled to the base of the first bipolar transistor, an emitter coupled to the emitter of the first bipolar transistor and a collector coupled to the collector of the first bipolar transistor, the third bipolar transistor being scaled to the first bipolar transistor.

2. The driver circuit of claim 1, wherein the second current limiting circuit comprises:
    a fourth bipolar transistor having a base coupled to the base of the third bipolar transistor, an emitter coupled to the emitter of the second bipolar transistor, and a collector coupled to the collector of the second bipolar transistor.

3. The driver circuit of claim 1, further comprising:
    a fifth bipolar transistor having a base coupled to the collector of the third bipolar transistor, and a current path coupled between the first voltage supply and the input of the first current source.

4. The driver circuit of claim 2, further comprising:
    a sixth bipolar transistor having a base coupled to the collector of the fourth bipolar transistor, and a current path coupled between the collector of the fourth bipolar transistor and the input of the second current source.

5. The driver circuit of claim 1, wherein the first and second current sources comprise a pair of CMOS transistors.

6. The driver circuit of claim 1, wherein the third bipolar transistor is scaled to the first bipolar transistor.

7. The driver circuit of claim 2, wherein the fourth bipolar transistor is scaled to the second bipolar transistor.

8. The driver circuit of claim 1, wherein the second current source is off when the first current source is on.

9. The driver circuit of claim 1, wherein the first current source is off when the second current source is on.

* * * * *